United States Patent
Lee

(10) Patent No.: US 7,575,998 B2
(45) Date of Patent: Aug. 18, 2009

(54) SEMICONDUCTOR DEVICE AND METAL LINE FABRICATION METHOD OF THE SAME

(75) Inventor: Jong Soon Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 175 days.

(21) Appl. No.: 11/615,661

(22) Filed: Dec. 22, 2006

(65) Prior Publication Data

US 2007/0166986 A1    Jul. 19, 2007

(30) Foreign Application Priority Data

Dec. 29, 2005    (KR)  ...................... 10-2005-0134348

(51) Int. Cl.
*H01L 21/4763*    (2006.01)

(52) U.S. Cl. ...................... 438/636; 438/637; 438/638; 438/643; 438/648; 438/718; 257/E21.026; 257/E21.311; 257/E21.314; 257/E21.582; 257/E21.589

(58) Field of Classification Search ................. 438/736, 438/636, 637, 638, 643, 648, 706, 713, 718, 438/720, 725; 257/E21.026, 252, 253, 311, 257/314, 578, 582, 589
See application file for complete search history.

(56) References Cited

U.S. PATENT DOCUMENTS

| | | | | |
|---|---|---|---|---|
| 4,522,681 A | * | 6/1985 | Gorowitz et al. | ............ 438/713 |
| 4,698,128 A | * | 10/1987 | Berglund et al. | ............ 438/701 |
| 5,656,128 A | * | 8/1997 | Hashimoto et al. | ............ 216/47 |
| 5,849,641 A | * | 12/1998 | Arnett et al. | ................. 438/734 |
| 5,858,879 A | * | 1/1999 | Chao et al. | .................. 438/725 |
| 6,133,145 A | * | 10/2000 | Chen | ......................... 438/636 |
| 6,165,862 A | * | 12/2000 | Ishikawa et al. | ............ 438/384 |
| 6,169,029 B1 | * | 1/2001 | Yang | ......................... 438/671 |
| 6,355,557 B2 | * | 3/2002 | Stinnett et al. | .............. 438/640 |
| 6,387,820 B1 | * | 5/2002 | Sanderfer | .................... 438/725 |
| 6,451,647 B1 | * | 9/2002 | Yang et al. | .................. 438/240 |
| 6,454,956 B1 | * | 9/2002 | Engelhardt et al. | ............ 216/53 |
| 6,905,971 B1 | * | 6/2005 | Tabery et al. | ................ 438/710 |
| 7,226,867 B2 | * | 6/2007 | Son et al. | ..................... 438/706 |
| 7,482,280 B2 | * | 1/2009 | Chang et al. | ................. 438/725 |
| 2002/0016071 A1 | * | 2/2002 | Hsia et al. | .................... 438/689 |
| 2006/0105574 A1 | * | 5/2006 | Regini et al. | ................ 438/706 |

\* cited by examiner

*Primary Examiner*—Michael S Lebentritt
(74) *Attorney, Agent, or Firm*—Sherr & Vaughn, PLLC

(57) ABSTRACT

Embodiments relate to a method for forming a wiring in a semiconductor device, that may include laminating a conductive layer for wiring formation on a semiconductor substrate, forming a photoresist layer pattern on the conductive layer, performing primary dry etching for the conductive layer after employing the photoresist layer pattern as a mask, thereby forming a wiring pattern, partially removing the photoresist layer pattern through secondary dry etching, thereby forming a passivation layer on a surface of the wiring pattern, performing tertiary dry etching for the wiring pattern and a diffusion barrier after employing the photoresist layer pattern as a mask, thereby forming a metal wiring, and removing the photoresist layer pattern.

15 Claims, 3 Drawing Sheets

SEMICONDUCTOR DEVICE AND METAL LINE FABRICATION METHOD OF THE SAME

The present application claims priority under 35 U.S.C. 119 and 35 U.S.C. 365 to Korean Patent Application No. 10-2005-0134348 (filed on Dec. 29, 2005), which is hereby incorporated by reference in its entirety.

BACKGROUND

A semiconductor device may be required to operate at high speed and simultaneously have mass storage capability. Accordingly, a semiconductor device may be manufactured to meet increasing requirements of better operation as well as the need for miniaturization.

A semiconductor device may include transistors, resistors, capacitors, etc. To electrically connect such a semiconductor device, wiring may be necessary. The wiring of a semiconductor device may have low resistance, may be economical, and may have high reliability. In a highly integrated semiconductor device, a width and thickness of the wiring may be reduced. Therefore, it may become a more difficult to form the wiring.

A metal used to form semiconductor wiring may primarily be fabricated of copper or aluminum. When made from copper, wiring may be formed through a damascene method. In this process, a trench may be formed in an insulation layer, and the trench may be filled with the copper. When made from aluminum, semiconductor wiring may be formed by forming an aluminum layer on an insulation layer, and selectively etching the aluminum layer. In this case, it may be possible to more easily form patterns than when using copper.

Aluminum wiring may be etched, for example by using etching gas such as $CHF_3$ and $N_2$. However, when using such a gas, a photo resist layer may also be etched when a metal layer is etched. Since the amount of the photo resist layer etched increases as the etching time of the metal layer increases, a thickness of the photo resist layer directly corresponds to the thickness of the metal layer.

According to the related art, since photoresist layer pattern (PR) may also be removed during an etching of conductive layer 104a, photoresist layer pattern (PR) may be thickly formed.

The etched photo resist layer may remain as polymers within an etching chamber instead of being volatilized. As a thickness of the photo resist layer increases, the amount of remaining polymers may also increase. Thus a cleaning cycle of the etching chamber may become shorter. The etching chamber may have a cycle of 10,000.

In addition, the gas used for the etching may cause particles by reacting with the photo resist layer and the metal layer. Such particles may be particles against etching, for example such as $Al(CF)_x$ and $AlF_x$ including Carbon (C). These particles may deteriorate a uniformity of etching, and may cause the short-circuiting of metal wiring within the semiconductor device.

SUMMARY

Embodiments relate to a semiconductor device and a method for forming wiring of the same. Embodiments relate to a method for forming wiring by etching a metal line in a semiconductor device, and a semiconductor device manufactured by using the method.

Embodiments relate to a semiconductor device and a method for forming the same, that may have uniformity of etching by reducing particles against etching, which may improve a reliability of a metal wiring.

According to embodiments, it may be possible to increase the production of products and to cause processes to be more stably performed by increasing the cleaning cycle of a chamber through reduction in the amount of polymers generated in etching.

In embodiments, a semiconductor device may include a semiconductor substrate, and a wiring pattern formed on the semiconductor substrate, wherein the wiring pattern is formed by etching a metal layer in a state in which the metal layer is etched in bulk through chemical dry etching, and then a passivation layer is formed on the metal layer through plasma dry etching.

In embodiments, a method for forming wiring in a semiconductor device may include laminating a conductive layer for wiring formation on a semiconductor substrate, forming a photoresist layer pattern on the conductive layer, performing primary dry etching for the conductive layer after employing the photoresist layer pattern as a mask, thereby forming a wiring pattern, partially removing the photoresist layer pattern through secondary dry etching, thereby forming a passivation layer on a surface of the wiring pattern, performing tertiary dry etching for the wiring pattern and a diffusion barrier after employing the photoresist layer pattern as a mask, thereby forming a metal wiring, and removing the photoresist layer pattern.

In embodiments, a method for forming wiring in a semiconductor device may include forming a conductive layer for wiring formation on a semiconductor substrate, forming a photoresist layer pattern on the conductive layer, performing isotropic etching after employing the photoresist layer pattern as a mask, thereby forming a wiring pattern, performing secondary dry etching for forming a passivation layer on a surface of the wiring pattern by polymers generated by removing the photoresist layer pattern, performing tertiary dry etching for the wiring pattern after employing the photoresist layer pattern as a mask, thereby forming a metal wiring, and removing the photoresist layer pattern.

According to embodiments, a metal wiring may be etched under conditions in which particles may not generated, so that it may be possible to prevent the metal wirings from being short-circuited due to the particles. Further, a metal layer may be etched through several steps instead of etching it at one time, so that it may be possible to reduce the occurrence of polymers against etching due to the reaction of the metal layer and the photo resist layer. Consequently, the cleaning cycle of the chamber may be reduced.

DETAILED DESCRIPTION OF EMBODIMENTS

Figure 1:
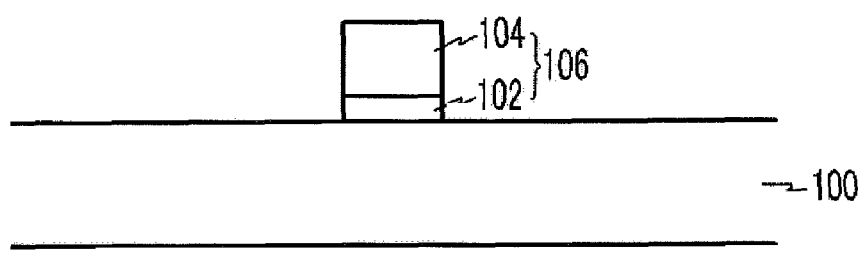
FIG. 1 is an example sectional diagram illustrating a wiring of a semiconductor device according to embodiments.

FIG. 1 is an example sectional diagram of a semiconductor device according to embodiments.

Referring to FIG. 1, metal wiring 106 may be formed on substrate 100. Metal wiring 106 may include diffusion barrier 102 and metal layer 104 that may be formed on diffusion barrier 102.

Substrate 100 may include a lower structure (not shown) such as transistors of a semiconductor device, or a lower wiring (not shown). Metal wiring 106 may be connected to the lower structure or the lower wiring.

Diffusion barrier 102 may have a single layer structure, for example, made from one of Ti and TiN, or a dual layer structure that may include the Ti and TiN.

Metal layer 104 may be made from aluminum or aluminum alloy (e.g. AlCu). According to embodiments, metal layer 104 may use AlCu containing Cu of 0.5%.

Metal layer 104 may be isotropically etched through a primary chemical dry etching. A passivation layer may be formed for metal layer 104 through a secondary plasma dry etching. Metal layer 104 may then be quickly etched, for example through a tertiary plasma dry etching in a state where the passivation layer has been formed. Through such an etching process, it may be possible to lengthen a cleaning cycle of an etching chamber, for example by removing polymers that may be generated while a photo resist layer is etched in bulk.

A process for etching the metal wiring may be classified into a secondary plasma dry etching and a tertiary plasma dry etching. In embodiments, the passivation layer may be formed for the metal wiring during the secondary plasma dry etching. The metal wiring may therefore be protected during the tertiary plasma dry etching. In the tertiary plasma dry etching, the metal wiring may be quickly etched. An etching time may thereby be reduced.

A method for forming the metal wiring of the semiconductor device according to embodiments will be described with reference to FIGS. 1 to 5.

Figure 2:
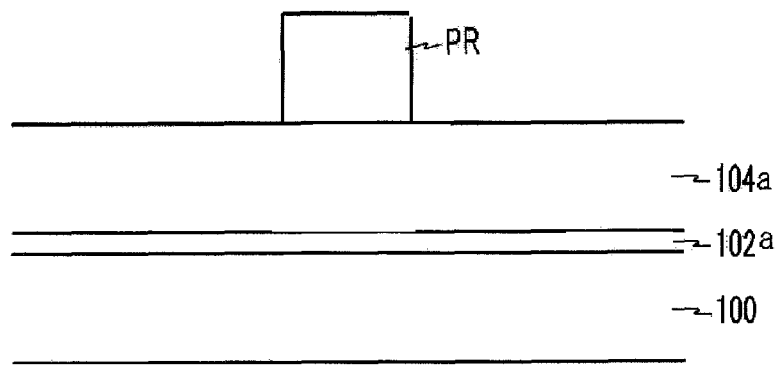
FIGS. 2 to 5 are example sectional diagrams illustrating a method for forming a wiring of a semiconductor device according to embodiments.

Referring to FIG. 2, diffusion barrier 102a and conductive layer 104a may be formed on a semiconductor device 100. Diffusion barrier 102a may be made from a dual layer (not shown), which may include a TiN layer and a Ti layer. Conductive layer 104a may be made from AlCu, which may contain Cu of 0.5%. Photoresist layer pattern (PR) may be formed on conductive layer 104a, for example through a photolithography process.

Figure 3:
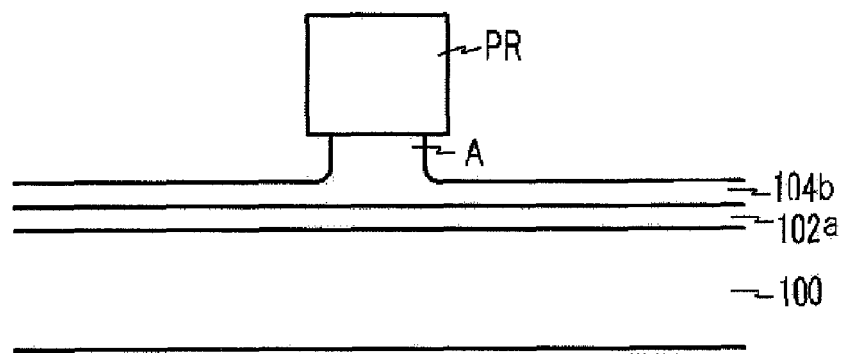

Referring to FIG. 3, a native oxide layer may be formed on conductive layer 104a, and may be removed through dry cleaning. According to embodiments, if a conductive layer containing aluminum is exposed to the air, it may easily be oxidized. A thin oxide layer may thus be formed on the conductive layer. Since such a native oxide layer may reduce the contact properties with another conductive layer, it may be necessary to remove the native oxide layer through the dry cleaning.

According to embodiments, the dry cleaning may be performed for approximately 10 seconds after C12 (cleaning gas) of approximately 90 to 110 sccm is injected while source power is provided at approximately 900 to 1100 W, bias power is provided at approximately 63 to 77 W, and a pressure is approximately 10 mT.

The first chemical dry etching may be performed for conductive layer 104a using photoresist layer pattern (PR) as a mask. Wiring pattern 104b may thus be formed.

The primary dry etching may be performed after C12 and BC13 (etching gases) of approximately 30 sccm and 70 sccm are respectively injected while source power is provided at approximately 900 to 1,100 W, and a pressure is approximately 10 mT. According to embodiments, since bias power may be 0 W, the primary dry etching may correspond to isotropic etching.

The primary dry etching may be performed until there is no difference (or substantially no difference) between upper and lower widths of first portion A remaining after the etching. Since the primary dry etching may correspond to isotropic etching, first portion A of wiring pattern 104b may have a width smaller than that of photoresist layer pattern (PR).

In the primary dry etching according to embodiments, it may be possible that photoresist layer pattern (PR) not be thickly formed. For example, since only conductive layer 104a may be etched and photoresist layer pattern (PR) is not etched, photoresist layer pattern (PR) may be thinly formed as compared to the related art. According to embodiments, it may therefore be possible to prevent particles against etching from being generated through the reaction with photoresist layer pattern (PR). Further, an amount of polymers existing in the etching chamber may thereby be reduced. Accordingly, a cleaning cycle of the etching chamber may be reduced. For example, according to embodiments, a cleaning cycle of an etching chamber may be reduced to 2,000. Consequently, a number of uses of the etching chamber available after onetime cleaning may increase, which may result greater production.

Figure 4:
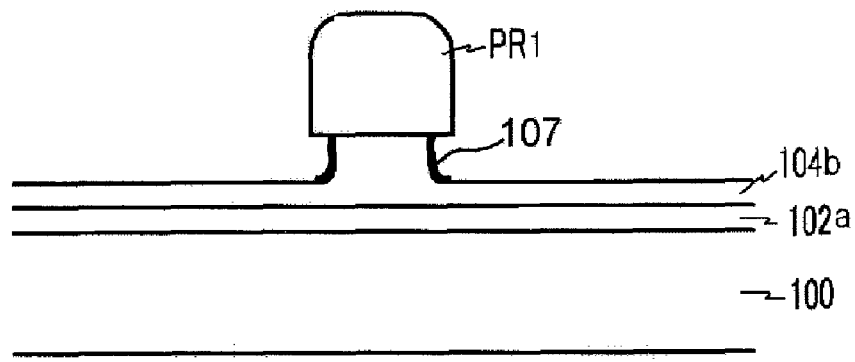

Referring to FIG. 4, photoresist layer pattern (PR) may be etched through the secondary dry etching and may form photoresist layer pattern (PR1) having a thickness thinner than that of photoresist layer pattern (PR).

The secondary dry etching may be performed after Ar and BC13 (etching gas) of approximately 90 to 110 sccm and 45 to 55 sccm, respectively, are injected in a state in which source power is approximately 900 to 1,100 W, bias power is approximately 135 to 165 W, and a pressure is approximately 7.2 to 8.8 mT.

The secondary dry etching may form passivation layer 107 on wiring pattern 104b. That is, in the secondary dry etching, many polymers that may be generated by partially removing photoresist layer pattern (PR) may attach to a surface of wiring pattern 104b. Passivation layer 107 may thus be formed. Passivation layer 107 may prevent wiring pattern 104b from being damaged in a subsequent process.

Figure 5:
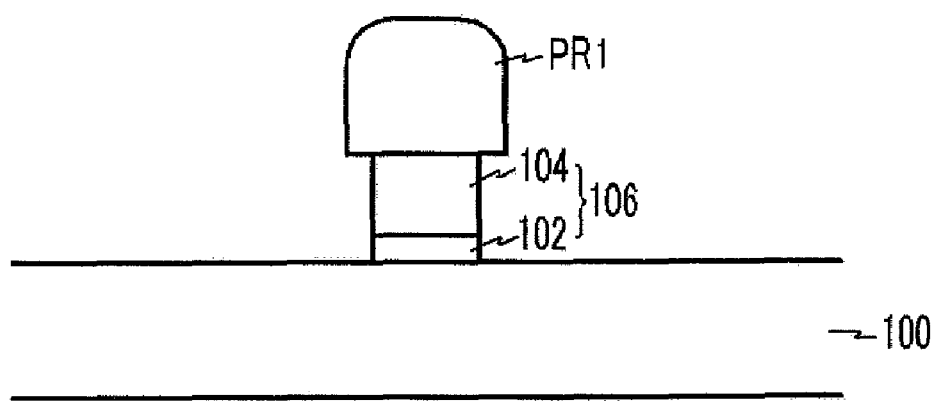

Referring to FIG. 5, the tertiary dry etching may be performed for wiring pattern 104b and diffusion barrier 102a and may use photoresist layer pattern (PR1) as a mask. Wiring 106, which may include diffusion barrier 102 and a metal layer 104, may be completed. In the tertiary dry etching, since the metal pattern 104b may be rapidly etched, a formation time of metal/wiring pattern 104b may be shortened. According to embodiments, this is because C12 may be used in the tertiary dry etching, and the metal pattern mainly made from aluminum may be rapidly etched.

The tertiary dry etching may be performed after C12, BC1, and Ar (etching gas) of 45 to 55 sccm, 45 to 55 sccm, and 36 to 44 sccm, respectively, are injected in a state in which source power is approximately 900 to 1,100 W, bias power is approximately 135 to 165 W, and a pressure is approximately 7.2 to 8.8 mT.

According to embodiments, the metal pattern 104b may be over-etched and may prevent short-circuiting among adjacent metal wirings. Accordingly, when an upper layer of substrate 100 is an insulation layer, the upper layer of the insulation layer may be partially removed.

In the tertiary dry etching, since C12 may be used and the metal wiring may be more rapidly etched, its function may be different from the formation of the passivation layer in the secondary dry etching. Further, a time of the tertiary dry etching may be shorter than that of the related art because the thickness of the metal pattern 104b may have been reduced for the time of the primary dry etching. Accordingly, in the tertiary dry etching, photoresist layer pattern (PR1) may be partially etched together with the metal pattern 104b. Polymers against etching may be generated. However, since a thickness of the photoresist layer pattern is relatively thin, an amount of polymers generated may be reduced. Consequently, the metal pattern 104b may be etched without interruption, and a cleaning cycle of the etching chamber may also be reduced.

Referring to FIG. 1, photoresist layer pattern (PR1) and the polymers generated in the tertiary dry etching may be removed, for example by using ashing. The ashing may be performed at a temperature of approximately 260° C. after $O_2$ of approximately 3,000 sccm is injected.

According to embodiments, a metal wiring may be etched under conditions in which particles may not be generated. It may therefore be possible to prevent the metal wirings from being short-circuited due to the particles.

Further, a metal layer may be etched through several steps instead of etching it at one time (e.g. in a single step). It may therefore be possible to reduce an occurrence of polymers against etching due to the reaction of the metal layer and the photo resist layer. Consequently, the cleaning cycle of the chamber may be reduced.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a photoresist layer pattern over a conductive layer;
   performing primary dry etching on the conductive layer using the photoresist layer pattern as a mask to form a wiring pattern;
   partially removing the photoresist layer pattern through secondary dry etching, to form a passivation layer over a surface of the wiring pattern; and
   performing tertiary dry etching on the wiring pattern and a diffusion barrier using the photoresist layer pattern as a mask to form a metal wiring.

2. The method of claim 1, wherein the conductive layer is formed by laminating the conductive layer for wiring formation on a semiconductor substrate, and wherein the photoresist layer pattern is removed after forming the metal wiring.

3. The method of claim 1, further comprising removing a native oxide layer formed over the conductive layer after forming the conductive layer.

4. The method of claim 3, wherein removing the native oxide layer is performed for approximately 10 seconds after Cl2 (cleaning gas) of 90 to 110 sccm is injected, and wherein a source power is 900 to 1,100 W, a bias power is 63 to 77 W, and a pressure is approximately 10 mT.

5. The method of claim 1, wherein forming the passivation layer comprises attaching polymers formed by partially removing the photoresist layer to a surface of the wiring pattern.

6. The method of claim 1, wherein the primary dry etching comprises isotropic etching.

7. The method of claim 6, wherein the isotropic etching is performed after Cl2 and BCl3 (etching gas) of 30 sccm and 70 sccm, respectively, are injected while source power is 900 to 1,100 W, and a pressure is 10 mT.

8. The method of claim 1, wherein the secondary dry etching is performed after Ar and BCl3 (etching gas) of 90 to 110 sccm and 45 to 55 sccm are respectively injected while source power is 900 to 1,100 W, bias power is 135 to 165 W, and a pressure is 7.2 to 8.8 mT.

9. The method of claim 1, wherein the tertiary dry etching is performed after Cl2, BCl and Ar (etching gas) of 45 to 55 sccm, 45 to 55 sccm and 36 to 44 sccm are respectively injected while source power is 900 to 1,100 W, bias power is 135 to 165 W, and a pressure is 7.2 to 8.8 mT.

10. The method of claim 1, wherein the diffusion barrier comprises at least one of Ti and TiN.

11. The method of claim 1, wherein the diffusion barrier is formed before the conductive layer is formed.

12. A method comprising:
    forming a conductive layer over a semiconductor substrate;
    forming a photoresist layer pattern over the conductive layer;
    forming a wiring pattern by performing isotropic etching using the photoresist layer pattern as a mask;
    forming a passivation layer over a surface of the wiring pattern by performing secondary dry etching; and
    forming a metal wiring by performing tertiary dry etching of the wiring pattern using the photoresist layer pattern as a mask.

13. The method of claim 12, further comprising removing the photoresist layer pattern after forming the metal wiring.

14. The method of claim 12, wherein the passivation layer comprises polymers generated by removing the photoresist layer pattern.

15. The method of claim 12, wherein at least Cl2 is used to perform the tertiary dry etching.

* * * * *